United States Patent [19]
Chu et al.

[11] B 3,995,215
[45] Nov. 30, 1976

[54] TEST TECHNIQUE FOR SEMICONDUCTOR MEMORY ARRAY

[75] Inventors: William M. Chu; George Sonoda, both of Poughkeepsie, N.Y.

[73] Assignee: International Business Machines Corporation, Armonk, N.Y.

[22] Filed: June 26, 1974

[21] Appl. No.: 483,268

[44] Published under the second Trial Voluntary Protest Program on March 9, 1976 as document No. B 483,268.

[52] U.S. Cl. .................... 324/158 R; 235/153 AC; 324/73 R; 324/158 T
[51] Int. Cl.$^2$ .................. G01R 31/00; G01R 31/26
[58] Field of Search .......... 324/73 R, 158 T, 158 R; 235/153 AC

[56] References Cited
UNITED STATES PATENTS
3,795,859  5/1974  Benante et al. ................. 324/158 T

*Primary Examiner*—R. V. Rolinec
*Assistant Examiner*—Ernest F. Karlsen
*Attorney, Agent, or Firm*—Theodore E. Galanthay

[57] ABSTRACT

Disclosed is a technique for testing electronic storage arrays including bistable storage cells fabricated in accordance with integrated semiconductor technology. Also described is the testing of load devices in a flip flop storage cell which is connected to a pair of bit lines that are inaccessible for the direct application of test signals. Testing is performed by altering the time duration of signals applied to the memory cells under test.

6 Claims, 5 Drawing Figures

TEST TECHNIQUE FOR SEMICONDUCTOR MEMORY ARRAY

Benante et al. U.S. Pat. No. 3,795,859, issued Mar. 5, 1974, entitled "Method and Apparatus for Determining the Electrical Characteristics of a Memory Cell Having Field Effect Transistors" and assigned to the assignee of the present invention.

BACKGROUND OF THE INVENTION

1. Field of the Invention

This invention relates to a technique for testing semiconductor memory arrays and more particularly to the testing of flip flop memory cells including load devices associated therewith.

2. Description of the Prior Art

Semiconductor memory arrays consisting of flip flop memory cells and fabricated in accordance with integrated semiconductor technology are well known in the art. Hundreds (or even thousands) of these flip flop memory cells may be formed into a single semiconductor chip measuring only a small fraction of a square centimeter in area. Such a semiconductor chip includes a minimum number of accessing terminals or "pads" by which it is electrically connected to other circuit elements in an overall system. Such a dense packing of memory cells with relatively few access terminals raises particular testing problems.

One possible technique for testing memory cells of the type described is to write desired binary information into the cells, pause for a predetermined time, and then read out the information and compare with the information first written into the cells. Such a technique appropriately dubbed the "pause test" is excessively time consuming. Normally, only a small number of the cells on a semiconductor chip can be addressed at any given time during a test in order not to disturb the test status of other cells in the array. Accordingly, the "pause test" must be repeated many times before a particular semiconductor chip is fully tested.

It is also possible to place extra pads on the chip specifically for test purposes. The addition of such pads, however, can decrease the available packing density on the chip and possibly degrade the overall operation of the chip. It is generally considered undesirable to add extra pads (or devices) for merely test purposes. For this reason, the most powerful test techniques are those which require no modification of the product in order to contribute to its testability.

SUMMARY OF THE INVENTION

Accordingly, it is a primary object of the present invention to test a semiconductor flip flop memory cell formed on a semiconductor memory chip without altering the said chip in any manner whatsoever for purposes of testing said cell.

It is another object of this invention to test a semiconductor memory array more quickly than is possible with prior art test techniques.

Lastly, it is an object of this invention to provide an improved test technique for testing semiconductor memory arrays at either the chip or module level for defective or marginally stable storage cells.

DESCRIPTION OF THE DRAWINGS

The foregoing and other objects, features and advantages of the invention will be apparent from the following and more particular description of the preferred embodiments of the invention as illustrated in the accompanying drawings.

FIG. 1B is a memory array to be tested by the presently disclosed technique.

DESCRIPTION OF THE PREFERRED EMBODIMENT

Figure 1:
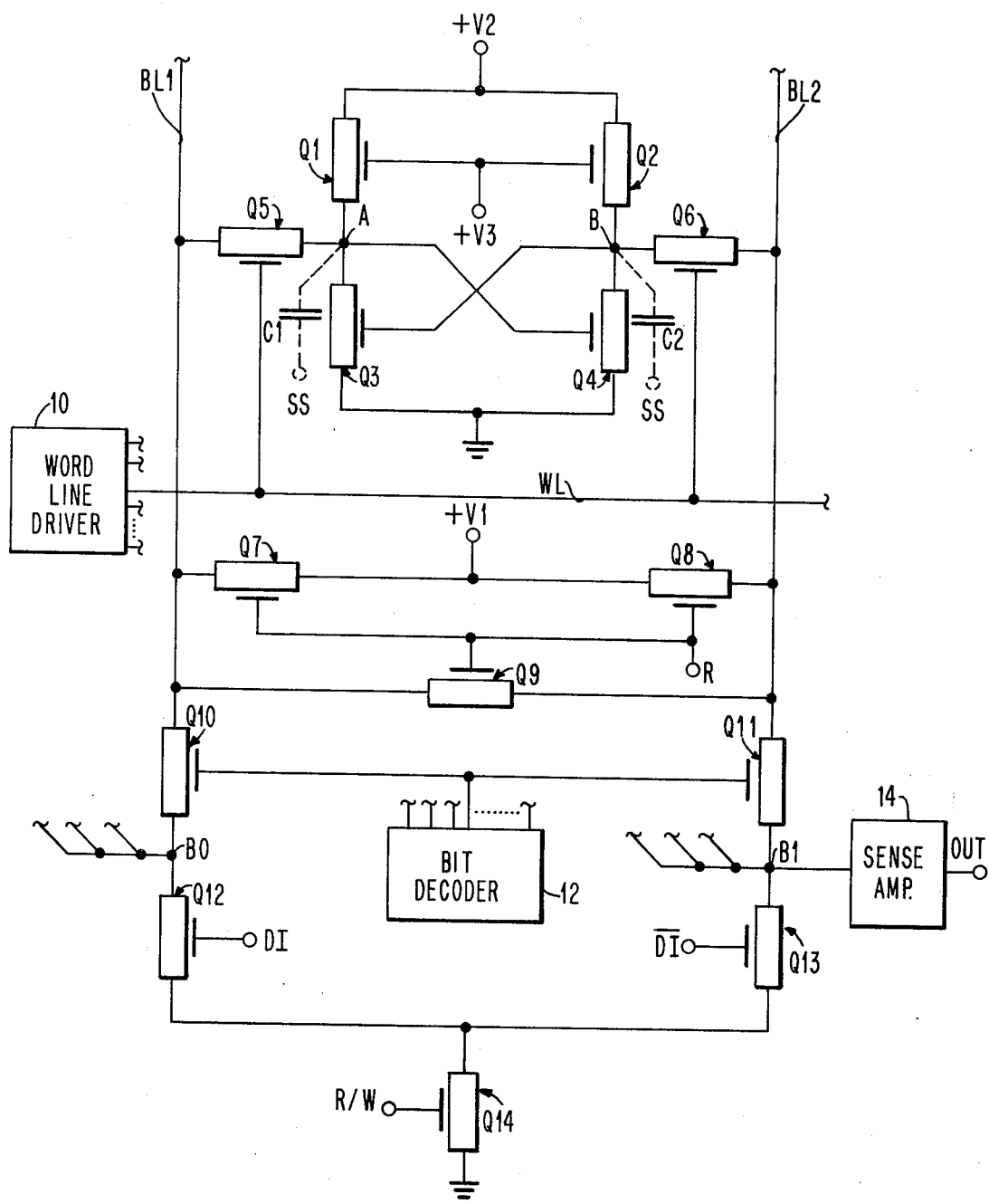
FIG. 1 is a memory cell to be tested by the present technique.

Refer now to FIG. 1 for a description of a memory cell testable by the present techniques. The entire circuit is embodied in n channel field effect transistors having drain source and gate electrodes and rendered conductive by an up level signal on the gate electrode. The present invention would be equally applicable, for example, for p channel field effect transistors which are rendered conductive by negative potentials on their gates, the terms up level, down level, and the charging and discharging of capacitances being relative terms usually interchanged for the operation of transistors of opposite conductivity type. The circuit of FIG. 1 includes cross coupled transistors Q3 and Q4 having their source electrodes commonly connected to ground. Load device Q1 is connected in a series path with Q3 between potential source +V2 and ground potential. Node A forming a common connection between transistors Q1 and Q3 has a parasitic capacitance C1 to the substrate SS. Load device Q2 is connected in a series path with cross coupled transistor Q4 between potential source +V2 and ground potential. The common node B between transistors Q2 and Q4 has a parasitic capacitance C2 to the substrate. Transistor Q5 has its gated electrodes (source and drain) connected in a series path between bit line 1 (BL1) and node A while transistor Q6 has its gated electrodes connected in a series path between node B and bit line 2 (BL2). The gating electrodes of transistors Q5 and Q6 are commonly connected and also receive a signal from word line driver 10. The gating electrode of transistors Q1 and Q2 are connected to a potential source +V3. It should be noted that the just described circuit structure is not novel per se but is rather presented to illustrate the test technique of the present invention. For example, see Sonoda U.S. Pat. No. 3,548,388. This patent invented by one of the coinventors herein, at FIG. 1 thereof, illustrates an arrangement of six transistors Q1 to Q6 similar to that presently shown even though not correspondingly numbered.

With continued reference to FIG. 1, transistors Q7 and Q8 have their drain and source electrodes connected in a series path between bit line 1 and bit line 2 while the common node between said two transistors is connected to the potential source +V1. The gates of these latter two transistors are connected in common with the gate of transistor Q9 and are adapted to receive a restore pulse at the restore terminal R. Transistor Q9 has its drain and source electrodes connected in a series path between the bit line 1 and bit line 2. Transistor Q10 has its drain and source electrode connected in a series path between bit line 1 and node B0. The gate of Q10 is connected to the gate of Q11 and receives at a designated time, an input signal from bit decoder 12. Transistor Q11 has its drain and source electrodes connected in a series path between bit line BL2 and node B1. Transistor Q12 has its drain and source electrode connected in a series path between the node B0 and the drain of Q14. Transistor Q13 has its drain and source electrodes connected in a series path between node B1 and the said drain electrode of Q14. Q14, in turn, has its drain and source electrodes connected in a series path between the source electrodes of Q12 and Q13 and ground potential. Transistor Q12 is adapted to receive at its gating electrode the data input terminal DI while Q13 receives the complemented data input at the indicated terminal. Transistor Q14 has its gate electrode connected to the R/W terminal adapted to receive a read/write input such that a down level input signal conditioning Q14 off represents a read cycle while an up level input conditioning Q14 on permits information to be written into the cell. Information is normally stored and represented by the binary levels of node A and B and may be sensed at both nodes B0 and B1 or either one of them. In the present example, single ended sensing at node B1 is illustrated by sense amplifier 14.

Figure 2:
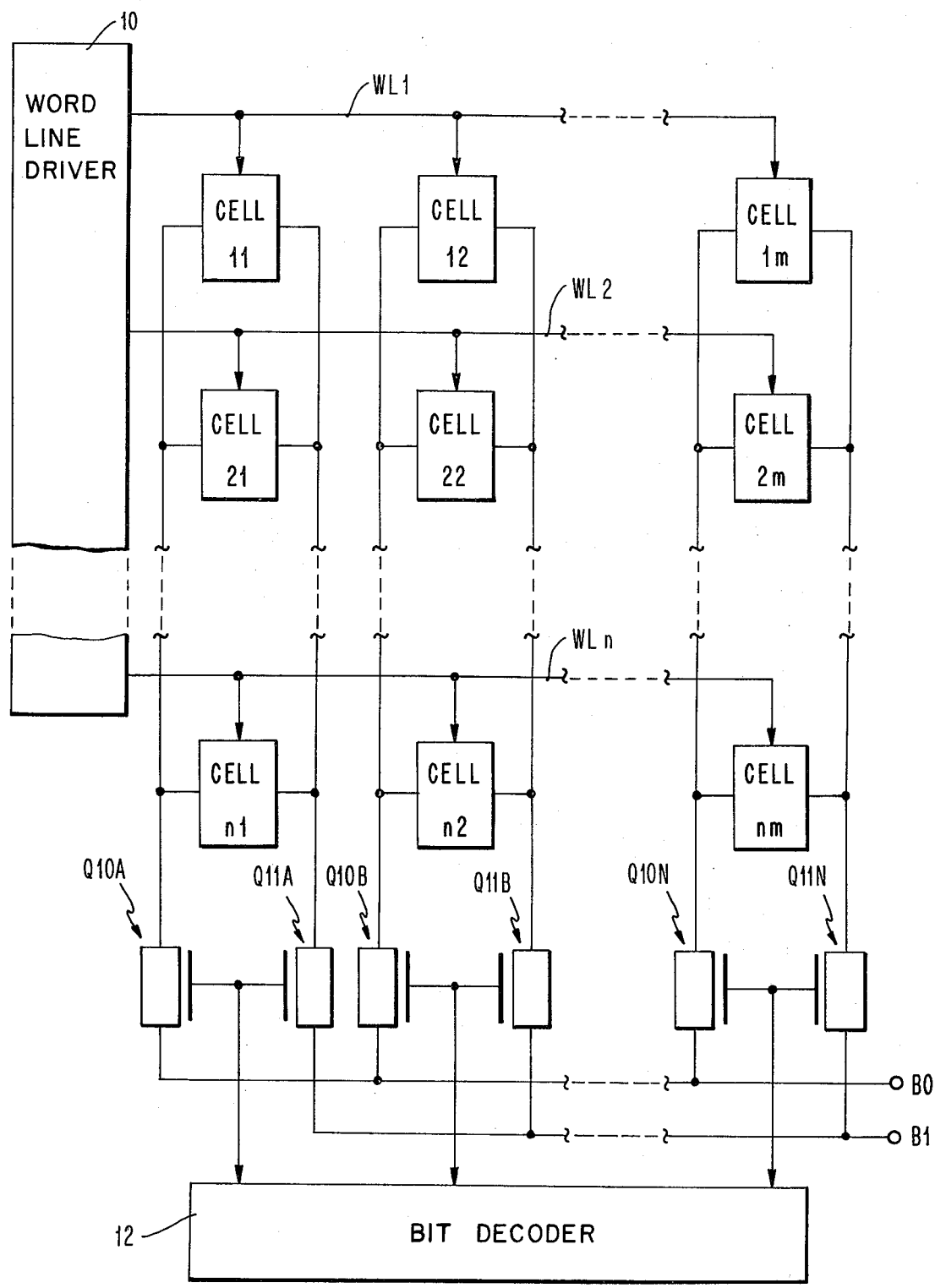

It will be appreciated that in a storage array, the cell illustrated by transistors Q1–Q6 is only one of a large number of cells arranged in rows and columns. Word line driver 10 is adapted to drive one of a large number of word lines WL while bit decoder 12 is adapted to drive one of a large number of columns leading to the gates of transistors such as Q10 and Q11. An arrangement of such cells into an array is illustrated by FIG. 2. Illustrated are M columns of cells and N rows of cells. Elements corresponding to FIG. 1 have been correspondingly labeled in so far as practical. Thus, word line driver 10 is illustrated driving word lines WL1, WL2, and WLn. Bit decoder 12 is shown driving the gates of transistors Q10A to Q10N and Q11A to Q11N. The nodes B0 and B1 are inaccessible circuit nodes corresponding to nodes B0 and B1 in FIG. 1.

OPERATION

Figure 3A:
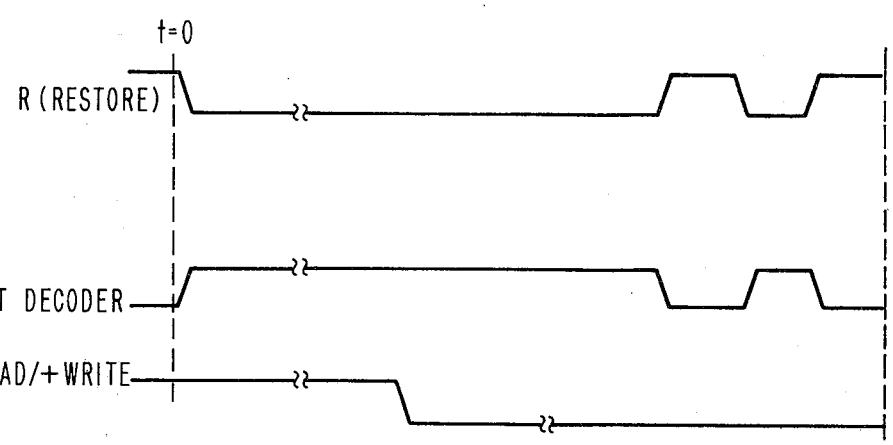
FIGS. 3A, 3B and 3C are waveform diagrams descriptive of the operation of the present invention.
Figure 3B:
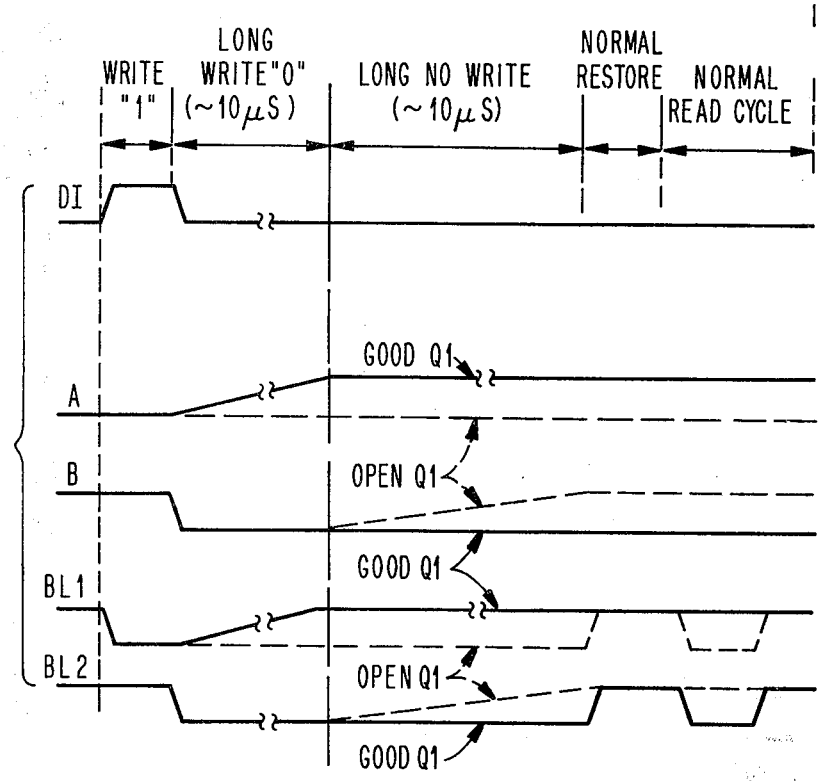
Figure 3C:
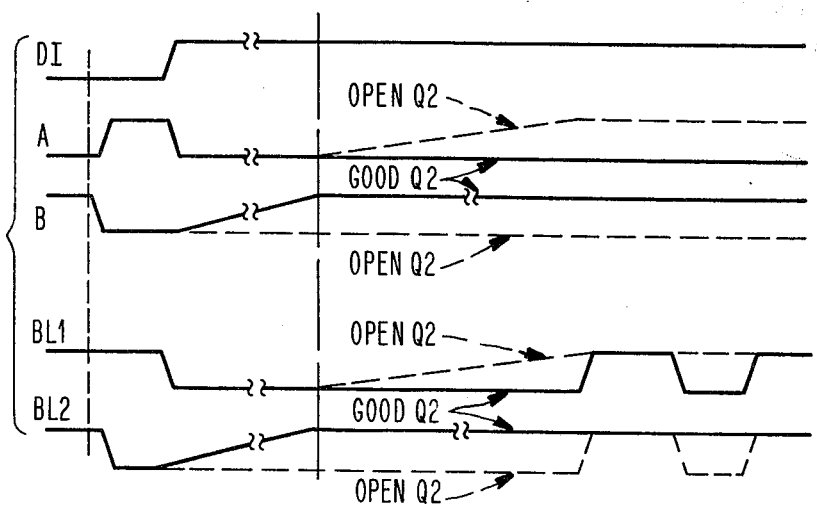

With continued reference to FIG. 1, refer also to FIGS. 3A, 3B and 3C. It will be appreciated that one of the advantageous features of the present invention is the ability to test the memory cell by using the existing word line driver, bit decoder, and sense amplifier associated with the semiconductor memory product. Before describing the operation of the present invention, it might be helpful to briefly explain the normal operation of the memory. Initially, a restore pulse is applied to the R terminal turning on transistors Q7, Q8 and Q9 bringing the bit lines BL1 and BL2 to an up level, Q9 assuring the equal potential level of the two lines. The restore pulse is then brought to a down level turning transistors Q7, Q8 and Q9 off. To select the particular cell of FIG. 1, the word line driver 10 brings the word line to an up level turning transistors Q5 and Q6 on. Similarly, bit decoder 12 brings the selected line up turning on transistors Q10 and Q11. For a read operation, transistor Q14 receives a down level signal keeping it off and effectively causing nodes B0 and B1 to float. These nodes are therefore brought to either an up or down level by the condition of the nodes A and B within the cell. Sense amplifier 14 then detects whether node B1 is at an up or down level providing the output of the cell. If a write operation is desired, transistor Q14 is turned on as is one of transistors Q12 and Q13. Thus, one of nodes B0 or B1 is forceably brought to ground potential bringing the corresponding node A or B within the cell to ground potential causing the flip flop to assume the desired state. After the desired data has been stored, the word line is brought to a down level by word line driver 10 turning transistors Q5 and Q6 off. At this point in time, it is incumbent on one of load transistors Q1 or Q2 to keep its corresponding node A or node B at an up level by means of load current. Thus, if the state of the cell required node A to be maintained at an up level, this would be accomplished by load current through Q1. This up level of node A would correspondingly maintain Q4 on, thereby maintaining node B at ground potential notwithstanding the load current through Q2.

The positive potentials +V1, +V2 and +V3 may all be equal to the same potential level such as +8.5 volts, for example, although the connecting of these terminals to three different potential levels permits slight variations in potential levels. Those skilled in the art are familiar with the various special considerations in field effect transistor fabrication which might make it desirable to provide diverse potential levels at the indicated potential terminals.

With continued reference to FIGS. 1 and 2, refer also to FIGS. 3A, 3B and 3C for a more detailed description of the operation of the present invention. The present technique tests a semiconductor memory cell by altering the duration of the applied timing signals. Accordingly, a select signal (not shown) is first applied to the semiconductor chip to select the array thereon for purposes of testing. A restore signal applied to the R terminal during the previous cycle precharged bit lines 1 and 2 to an up level. The restore pulse is then brought to a down level turning transistors Q7, Q8 and Q9 off. At this time, the word line driver 10 and bit decoder 12 apply up level signals as shown in the second waveform of 3A at the beginning thereof. Also in FIG. 3A, is indicated that a write function is first performed by applying an up level signal to the gate of transistor Q14. The application of data input signals to the gates of Q12 and Q13 in the form of either a binary 0 or 1 depends on the type of test to be performed.

Assume first that it is desired to test load transistor Q1 as to whether it is good or open (bad). It will be recalled that it is the function of Q1, in normal operation, to maintain node A at an up level when an up level potential is to be stored at that node. In order to perform the present test, a binary 1 is written into the cell by turning transistor Q12 on and Q13 off. This brings bit line 1 to a down level while bit line 2 remains at its precharged level. In accordance with the present invention, the normal write period is followed by an abnormally long write period of opposite binary value data. In the present case, a binary 0 is written by turning transistor Q12 off and turning Q13 on for a duration of approximately 10 microseconds. This brings bit line 2 to ground in the conductive path through Q11, Q13 and Q14. It is noted that FIGS. 3A and 3B are in time relationship such that the word line and bit decode signals as well as the write signal to the gate of Q14 are still all at an up level. When writing the 0 by pulling bit line 2 to a down level, node B is also brought to a down level. If Q1 is good it will slowly charge node A to an up level also bringing bit line 1 to an up level. However, if Q1 is bad and does not charge node A up, then both nodes and both bit lines will remain at a down level during the long write period. The long write period is followed by a long read or long "no write" period also approximately 10 microseconds in duration. This is accomplished by bringing the R/W terminal to the gate of Q14 to a down level turning Q14 off. If Q1 is good, there is no further change to the condition of the nodes and bit lines, as noted in solid lines in FIG. 3B, and the correct information can be read by sense amplifier 14 at node B1. If, however, Q1 is open as indicated in dotted lines in FIG. 3B, then node A and bit line 1 cannot be brought to an up level after Q14 is turned off. This occasions the undesirable alternative of node B being brought to an up level by current through load transistor Q2 thereby bringing node B and bit line 2 to an up level. During the subsequent normal restore period illustrated in FIG. 3B, both bit lines are brought to an up level while word line driver 10 and bit decoder 12 provide down level signals. During the subsequent normal read cycle, sense amplifier 14 will sense the condition of node B through bit line 2. If Q1 is operating properly, a zero will be read as illustrated by the solid line. In the alternative, if Q1 is bad or open as described, a 1 will be read as indicated by dotted lines.

Reference to FIG. 3C will indicate that the testing of load device Q2 is performed in an identical manner except that a zero is first written with a subsequent long write of a binary 1 followed by a long "no write" of a binary 1. The zero is first written by the application of a down level signal to the gate of Q12 with an up level signal to the gate of Q13. The subsequent long writing of a binary 1 is accomplished by bringing the gate of Q12 to an up level while the gate of Q13 is brought to a down level. In the last step of the test which is the normal read cycle, a binary 1 will be read if load device Q2 is good as shown in solid lines in FIG. 3C. An open load device Q2 will provide a binary 0 as indicated by dotted lines at bit line 2 in FIG. 3C.

In order to provide tests in addition to the open load tests for Q1 and Q2 just described, the present techniques are also useful for screening out cells that are marginal in stability due to various defects such as leakage currents and threshold voltage mismatches. In the indicated examples, a total of 20 microseconds was used as an example for the long write and long no write portions of the test cycle. By shortening the long write period to some intermediate time less than 10 microseconds, as opposed to the 10 microseconds indicated in FIG. 3B, for example, node A would have sufficient time to charge to its full up level even though transistor Q1 was good. Similarly, by shortening the long no write time interval, node B would not have an opportunity to fully charge up even though Q1 is open. Thus, the time interval can be shortened sufficiently for good Q1 devices to give indications of a bad test. The same result of course can be accomplished with respect to Q2 at FIG. 3C. More importantly, such slower charging rates actually test the stability of the entire cell, not just load devices Q1 and Q2. For example, by successively shortening the test interval until certain cell(s) fail, the weakest "good" cells in the array can be detected.

It should here be pointed out that the long no-write period is not necessary for the present invention. It has been found that the normal restore period can follow the long write period immediately. During the normal restore period, a sufficient potential difference between nodes A and B is established, permitting the defective cell to be read during the normal read cycle. In the case of performing a cell stability test, the duration of the normal restore period may be varied permitting the long no write period to be omitted. In this latter case, a longer than normal restore period (during which time the WL driver and bit decoders are down) is varied to arrive at the optimum time period at which marginal cells begin to fail.

In conclusion, what has then been described is a test technique which permits the testing of a semiconductor array in a small fraction of the time required for the herein described pause test. No extra pads are required and the test can be performed both at the chip and module level. Furthermore, no additional overhead circuitry is required and the test is readily performed at various temperature and humidity levels. In addition to providing a more definitive open load device test while requiring a much shorter testing period, the present technique also provides a rigorous cell stability test.

While the invention has been particularly shown and described with reference to preferred embodiments thereof, it will be understood by those skilled in the art that various changes in form and detail may be made therein without departing from the spirit and scope of the invention.

What is claimed is:

1. A method of testing a semiconductor storage array including bistable storage cells, each storage cell coupled to first and second bit lines, comprising the steps of:
   applying a first logic level signal to said first bit line while applying a second logic level signal to said second bit line thereby writing a signal having a first binary value into a selected storage cell;
   applying a second logic level signal to said second bit line while applying a first logic level signal to said first bit line thereby writing a signal having a second binary value into said selected storage cell, said last mentioned writing step having a much longer time duration than normally required for writing a signal into said storage cell; and
   determining whether said cell contains said first or second binary value.

2. Method as in claim 1 wherein prior to the step of determining whether said cell contains said first or second binary value, there is provided the step of:
   providing a read signal to said selected storage cell, said reading step having a much longer time duration than normally required for reading a signal from said storage cell.

3. Method as in claim 2 wherein the time duration of said second step of writing is varied to locate marginally failing cells.

4. Method as in claim 1 wherein the time duration of said second step of writing is varied to locate marginally failing cells.

5. In a semiconductor storage array having bistable storage cells, including a pair of cross coupled transistors, a load device connected to each said cross coupled transistors forming a pair of nodes, and an isolation device connected to each said node, and an accessing line connected to the other side of each said isolation devices, a test process for testing each of said cells in said array comprising the steps of:
   applying a differential potential level to said nodes by opening said isolation devices while maintaining a different relative potential level on each of said accessing lines;
   reversing the relative potential levels of said accessing lines;
   waiting for a predetermined time;
   closing said isolation devices;
   bringing both said accessing lines to the same potential level; and
   reopening said isolation devices and sensing the potential level of at least one of said accessing lines.

6. Test process as in claim 5 wherein prior to the step of reopening said isolation devices there is provided the step of:
   floating said accessing lines.

* * * * *